US012532421B2

(12) United States Patent
Yoo et al.

(10) Patent No.: US 12,532,421 B2
(45) Date of Patent: Jan. 20, 2026

(54) INTEGRATED FASTENING STRUCTURE AND ELECTRONIC DEVICE INCLUDING THE SAME

(71) Applicant: SAMSUNG ELECTRONICS CO., LTD., Suwon-si (KR)

(72) Inventors: Minjae Yoo, Suwon-si (KR); Youngmin Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 200 days.

(21) Appl. No.: 18/230,012

(22) Filed: Aug. 3, 2023

(65) Prior Publication Data

US 2024/0147641 A1    May 2, 2024

Related U.S. Application Data

(63) Continuation of application No. PCT/KR2023/010110, filed on Jul. 14, 2023.

(30) Foreign Application Priority Data

Oct. 26, 2022    (KR) .................. 10-2022-0139106

(51) Int. Cl.
*H05K 5/02* (2006.01)
*H05K 7/20* (2006.01)

(52) U.S. Cl.
CPC ....... *H05K 5/0217* (2013.01); *H05K 7/20963* (2013.01)

(58) Field of Classification Search
CPC .......................... H05K 5/0217; H05K 7/20963
See application file for complete search history.

(56) References Cited

U.S. PATENT DOCUMENTS 3,733,655 A * 5/1973 Kolibar ................... F16B 5/065
                                                            411/479
6,574,101 B2 * 6/2003 Tanaka ................... H01L 23/467
                                                            257/E23.099

(Continued)

FOREIGN PATENT DOCUMENTS

JP            3484009 B2    1/2004
JP        2007-096183 A    4/2007
(Continued)

OTHER PUBLICATIONS

Search Report issued on Oct. 18, 2023 by International Searching Authority in corresponding International Application No. PCT/KR2023/010110.

(Continued)

*Primary Examiner* — Mukundbhai G Patel
(74) *Attorney, Agent, or Firm* — Sughrue Mion, PLLC

(57) ABSTRACT

An electronic device includes: a first structure including a first fastening structure; a second structure disposed on an upper portion of the first structure and including a second fastening structure; a third structure disposed on an upper portion of the second structure and including a third fastening structure; and an integrated fastening structure including a first engagement portion and a second engagement portion, the integrated fastening structure being configured to directly connect the first structure, the second structure, and the third structure. Each of the first engagement portion and the second engagement portion is configured to engage a different fastening structure among the first fastening structure, the second fastening structure, and the third fastening structure.

20 Claims, 18 Drawing Sheets

(56) References Cited

U.S. PATENT DOCUMENTS

| | | | |
|---|---|---|---|
| 10,877,515 B2 | 12/2020 | Kim et al. | |
| 2020/0049186 A1* | 2/2020 | Ai | F16B 21/086 |
| 2020/0146190 A1 | 5/2020 | Seo et al. | |

FOREIGN PATENT DOCUMENTS

| | | |
|---|---|---|
| JP | 2008-182178 A | 8/2008 |
| JP | 4697163 B2 | 6/2011 |
| KR | 0148641 B1 | 12/1998 |
| KR | 20-2000-0000940 U | 1/2000 |
| KR | 10-2006-0060979 A | 6/2006 |
| KR | 10-2006-0086126 A | 7/2006 |
| KR | 10-0684859 B1 | 2/2007 |
| KR | 10-0708861 B1 | 4/2007 |
| KR | 20-2010-0006457 U | 6/2010 |
| KR | 10-1584262 B1 | 1/2016 |
| KR | 10-2020-0050261 A | 5/2020 |
| KR | 10-2021-0094406 A | 7/2021 |
| KR | 10-2022-0135961 A | 10/2022 |
| WO | 2019/050243 A1 | 3/2019 |

OTHER PUBLICATIONS

Written Opinion issued on Oct. 18, 2023 by International Searching Authority in corresponding International Application No. PCT/KR2023/010110.

Communication issued Sep. 12, 2025 by the European Patent Office in European Patent Application No. 23882827.1.

* cited by examiner

INTEGRATED FASTENING STRUCTURE AND ELECTRONIC DEVICE INCLUDING THE SAME

CROSS-REFERENCE TO RELATED APPLICATIONS

This application is a continuation application of International Application No. PCT/KR2023/010110 designating the United States, filed on Jul. 14, 2023, in the Korean Intellectual Property Receiving Office, which claims priority from Korean Patent Application No. 10-2022-0139106, filed on Oct. 26, 2022, in the Korean Intellectual Property Office, the disclosures of which are hereby incorporated by reference herein in their entireties.

BACKGROUND

1. Field

The disclosure relates to a plurality of stacked structures constituting an electronic device, e.g., an integrated fastening structure that integrates a chassis, a PCB, and a heat sink and an electronic device including the integrated fastening structure.

2. Description of Related Art

Various types of electronic devices, including various display devices, such as televisions and monitors, may include a plurality of structures that need to be stacked and fixed therein. An electronic device may include, e.g., a printed circuit board (PCB) on which various circuit elements are disposed, and a chassis provided to support the printed circuit board. The electronic device may also include a component for dissipating the high heat generated when the circuit element is driven at high frequency, e.g., a heat sink attached to the circuit element. The printed circuit board, heat sink, and chassis provided in the electronic device need to be fixed to each other by fastening members.

A typical way to fasten three or more structures is to fasten two of the structures via a fastening structure and then fasten the fastened structures with another structure via another fastening structure. For example, for the above-described printed circuit board, heat sink, and chassis, the printed circuit board and the heat sink are fastened by fastening members, e.g., push pins or screws, and may then be fastened with the chassis by separate fastening structures, e.g., screws.

SUMMARY

Various embodiments of the disclosure may provide an integrated fastening structure for fastening a plurality of inner structures and an electronic device including the integrated fastening structure.

According to an embodiment, an electronic device may include: a first structure including a first fastening structure; a second structure disposed on an upper portion of the first structure and including a second fastening structure; a third structure disposed on an upper portion of the second structure and including a third fastening structure; and an integrated fastening structure including a first engagement portion and a second engagement portion, the integrated fastening structure being configured to directly connect the first structure, the second structure, and the third structure. Each of the first engagement portion and the second engagement portion may be configured to engage a different fastening structure among the first fastening structure, the second fastening structure, and the third fastening structure.

According to an embodiment, the first engagement portion may be configured to engage to the first fastening structure on a lower portion of the first structure that is opposite to the upper portion of the first structure. The second engagement portion may be configured to engage the second fastening structure on a lower portion of the second structure that is opposite to the upper portion of the second structure or engage the third fastening structure on an upper portion of the third structure.

According to an embodiment, the first fastening structure may include a first hole, the second fastening structure comprises a second hole, and the third fastening structure comprises a third hole. Each of the first engagement portion and the second engagement portion may be configured to pass through at least one the first hole, the second hole, or the third hole.

According to an embodiment, each of the first engagement portion and the second engagement portion may be configured to pass through at least one of the first fastening structure, the second fastening structure, and the third fastening structure by elastic deformation.

According to an embodiment, the integrated fastening structure may further include a shaft extending between (i) a lower end of the shaft positioned on a lower portion of the first structure that is opposite to the upper portion of the first structure and (ii) an upper end of the shaft positioned on an upper portion of the third structure. The first engagement portion may include: a first center portion extending from a position proximal to the lower end of the shaft in a direction perpendicular to an axis of the shaft, and a pair of first engagement protrusions extending toward the upper end of the shaft from two opposite sides of the first center portion and inclined away from the shaft. The pair of first engagement protrusions may be configured to be elastically deformable in a direction towards the shaft in response to an external force applied in the direction perpendicular to the axis of the shaft.

According to an embodiment, the second engagement portion may include: a second center portion extending from a predetermined position that is between the upper end of the shaft and the lower end of the shaft, in the direction perpendicular to the axis of the shaft, and a pair of second engagement protrusions extending toward the upper end of the shaft from two opposite sides of the second center portion and inclined away from the shaft. The second engagement protrusions may be configured to be elastically deformable in the direction towards the shaft due to the external force applied in the direction perpendicular to the axis of the shaft.

According to an embodiment, the second engagement portion may include: a second center portion extending from a position proximal to the upper end of the shaft in the direction perpendicular to the axis of the shaft, and a pair of second engagement protrusions extending toward the lower end of the shaft from two opposite sides of the second center portion and inclined away from the shaft. The second engagement protrusions may be configured to be elastically deformable in the direction towards the shaft due to the external force applied in the direction perpendicular to the axis of the shaft.

According to an embodiment, the integrated fastening structure may further include a shaft that extends between (i) a lower end of the shaft that is configured to be positioned on a lower portion of the first structure that is opposite to the upper portion of the first structure and (ii) an upper end of the shaft that is configured to be positioned on an upper portion of the third structure. The first engagement portion may include a pair of first engagement protrusions that form a rhombus shape that has a first diagonal line portion of the shaft proximal to the lower end of the shaft, the pair of first engagement protrusions being disposed on two opposite sides of the shaft. The pair of first engagement protrusions may be configured to be elastically deformable in a direction towards the shaft in response to an external force applied in a direction perpendicular to an axis of the shaft.

According to an embodiment, the second engagement portion may include a pair of second engagement protrusions forming a rhombus shape that has a second diagonal line portion of the shaft at a predetermined position between the upper end of the shaft and the lower end of the shaft, the pair of second engagement protrusions being disposed on two opposite sides of the shaft. The second engagement protrusions may be configured to be elastically deformable in the direction towards the shaft due to the external force applied in the direction perpendicular to the axis of the shaft.

According to an embodiment, the second engagement portion may include a pair of second engagement protrusions forming a rhombus shape that has a second diagonal line portion of the shaft proximal to the upper end of the shaft, the pair of second engagement protrusions being disposed on two opposite sides of the shaft. The second engagement protrusions may be configured to be elastically deformable in a direction towards the shaft in response to the external force applied in the direction perpendicular to the axis of the shaft.

According to an embodiment, the integrated fastening structure may further include a shaft extending between (i) a lower end of the shaft positioned on a lower portion of the first structure that is opposite to the upper portion of the first structure and (ii) an upper end of the shaft positioned on an upper portion of the third structure. The first engagement portion may be disposed proximal to the lower end of the shaft, and the second engagement portion is disposed at a predetermined position between the upper end of the shaft and the lower end of the shaft. The integrated fastening structure may further include: a stopper portion disposed proximal to the upper end of the shaft; and at least one elastic member disposed to surround the shaft in at least one of a space between the first engagement portion and the second engagement portion or a space between the second engagement portion and the stopper portion.

According to an embodiment, the integrated fastening structure may further include a shaft extending between (i) a lower end of the shaft positioned on a lower portion of the first structure that is opposite to the upper portion of the first structure and (ii) an upper end of the shaft positioned on an upper portion of the third structure. The first engagement portion may be disposed proximal to the lower end of the shaft, and the second engagement portion is disposed proximal to the upper end of the shaft. The integrated fastening structure may further include: a stopper portion disposed between the first engagement portion and the second engagement portion; and at least one elastic member disposed to surround the shaft in at least one of a space between the first engagement portion and the stopper portion or a space between the stopper portion and the second engagement portion.

According to an embodiment, the first structure may be a portion of a chassis forming a portion of an exterior of the electronic device. The second structure may be a portion of a printed circuit board (PCB). The third structure may include a heat sink for dissipating heat from the PCB.

According to an embodiment, an integrated fastening structure configured to directly connect a plurality of structures of an electronic device may include: a shaft extending between an upper end of the shaft and a lower end of the shaft; a first engagement portion provided at the lower end of the shaft, the first engagement portion including a pair of first engagement protrusions configured to be elastically deformable in a direction towards the shaft in response to an external force applied in a direction perpendicular to an axis of the shaft; and a second engagement portion provided at the upper end of the shaft or at a predetermined position between the upper end of the shaft and the lower end of the shaft, the second engagement portion including a pair of second engagement protrusions configured to be elastically deformable in the direction towards the shaft in response to the external force applied in the direction perpendicular to the axis of the shaft.

According to an embodiment, the first engagement portion may further include a center portion extending in the direction perpendicular to the axis of the shaft. Each of the pair of first engagement protrusions may extend toward the upper end of the shaft from two opposite sides of the center portion and is inclined away from the shaft.

According to an embodiment, the second engagement portion may further include a center portion extending in the direction perpendicular to the axis of the shaft. Each of the pair of second engagement protrusions may extend toward the lower end of the shaft or the upper end of the shaft from two opposite sides of the center portion and is inclined away from the shaft.

According to an embodiment, at least one of the pair of first engagement protrusions or the pair of second engagement protrusions may form a rhombus shape having a diagonal line portion of the shaft, and extends symmetrically on two opposite sides of the shaft.

According to an embodiment, the plurality of structures may include: a first structure including a first fastening structure, a second structure disposed on an upper portion of the first structure and including a second fastening structure, and a third structure disposed on an upper portion of the second structure and including a third fastening structure.

According to an embodiment, the first structure may be a portion of a chassis that forms a portion of an exterior of the electronic device. The second structure may be a portion of a printed circuit board (PCB). The third structure may include a heat sink for dissipating heat from the PCB.

According to an embodiment, the first engagement portion may be configured to engage to the first fastening structure on a lower portion of the first structure that is opposite to the upper portion of the first structure. The second engagement portion may be configured to (i) engage to the second fastening structure on a lower portion of the second structure that is opposite to the upper portion of the second structure or (ii) engage to the third fastening structure on an upper portion of the third structure.

According to various embodiments of the disclosure, it is possible to simultaneously fasten a plurality of structures in an electronic device, e.g., a heat sink, PCB, and chassis in a TV device, using an integrated fastening structure. Thus, it is possible to reduce the number of fastening members for fastening the heat sink, PCB, and chassis and the fastening structures on PCB for the fastening members. It is also possible to shorten the production process and increase the circuit design space of the PCB.

Effects of the disclosure are not limited to the foregoing, and other unmentioned effects would be apparent to one of ordinary skill in the art from the following description. In other words, unintended effects in practicing embodiments of the disclosure may also be derived by one of ordinary skill in the art from the embodiments of the disclosure.

BRIEF DESCRIPTION OF THE DRAWINGS

The same or similar reference denotations may be used to refer to the same or similar elements throughout the specification and the drawings.

DETAILED DESCRIPTION

Figure 1:
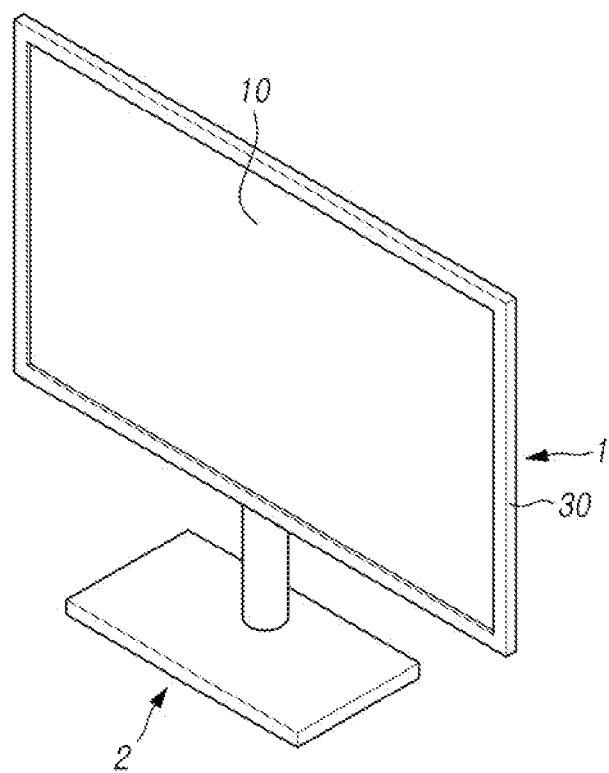
FIG. 1 is a perspective view illustrating an electronic device according to an embodiment.

Embodiments of the disclosure are now described with reference to the accompanying drawings in such a detailed manner as to be easily practiced by one of ordinary skill in the art. However, the disclosure may be implemented in other various forms and is not limited to the embodiments set forth herein. The same or similar reference denotations may be used to refer to the same or similar elements throughout the specification and the drawings. Further, for clarity and brevity, no description is made of well-known functions and configurations in the drawings and relevant descriptions.

Figure 2:
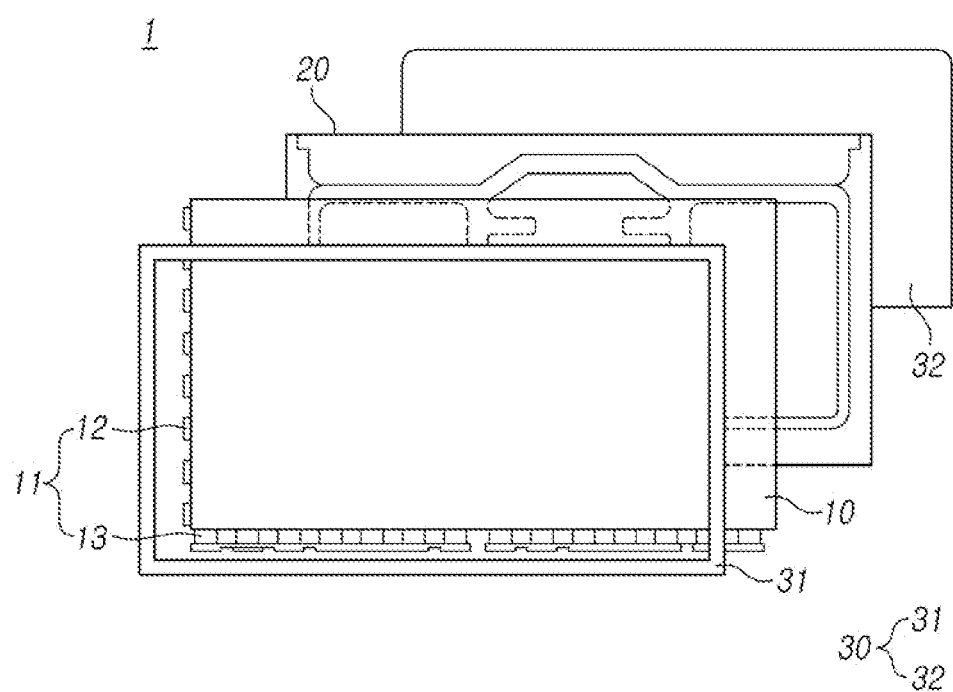
FIG. 2 is an exploded view illustrating an electronic device according to an embodiment.

FIG. 1 is a perspective view illustrating an electronic device according to an embodiment. FIG. 2 is an exploded view illustrating an electronic device according to an embodiment.

Referring to FIGS. 1 and 2, in an embodiment, the electronic device 1 may include a display device such as a television (TV), or a monitor, but the disclosed embodiments are not limited thereto. According to an embodiment of the disclosure, the electronic device may be another type of display device that displays an image, such as a display device of a mobile communication terminal, or may be another type of electronic device, and the disclosed embodiments are not limited to a specific type. Hereinafter, for convenience of description, a case in which the electronic device 1 is a display device will be mainly described.

According to an embodiment, the electronic device 1 may be configured to display an image to the outside and output a sound. In an embodiment, the sound may be output through a separate sound device (e.g., a speaker) provided outside the electronic device 1. In an embodiment, the electronic device 1 may be supported by a stand 2 mounted thereunder, but is not limited thereto. For example, although not specifically illustrated, the electronic device 1 may be installed and fixed to a wall through VESA holes and a bracket (not illustrated) provided on one side thereof.

According to an embodiment, the electronic device 1 may include a display panel 10, a chassis 20, and a housing 30.

According to an embodiment, the display panel 10 may be configured to output visual information such as an image to the outside. The display panel 10 may include, e.g., an image driver 11 configured to drive an image. The image driver 11 may include a first image driver 12 configured to drive an X electrode and a second image driver 13 configured to drive a Y electrode. The X electrode may correspond to a source electrode, and the Y electrode may correspond to a gate electrode. The first image driver 12 and the second image driver 13 may be implemented by a circuit element disposed on a printed circuit board (PCB) (hereinafter, referred to as a PCB), which is described below (see FIG. 3). Although not specifically illustrated, the electronic device 1 may include a heat sink for dissipating heat generated by a circuit element on the PCB.

According to an embodiment, the chassis 20 may be a frame that receives various components necessary for various functions such as image display and sound output in the electronic device 1. In an embodiment, at least one PCB 40 and an input/output device (not shown) may be mounted on the chassis 20. In an embodiment, the chassis 20 may be disposed on one side (e.g., rear) of the display panel 10. In an embodiment, the chassis 20 may be formed of a metal material having excellent heat dissipation and strength. In an embodiment, the chassis 20 may be formed of a conductive material.

According to an embodiment, the housing 30 may substantially form the overall appearance of the electronic device 1. In an embodiment, the housing 30 may include a bezel 31 and a housing cover 32. In an embodiment, the bezel 31 may form a portion of the front portion of the electronic device 1. In an embodiment, the bezel 31 may be configured to support the display panel 10. For example, the bezel 31 may be provided, in a center portion thereof, with an opening substantially corresponding to the shape of the display panel 10. In this case, the display panel 10 may be fixed by the bezel 31. In an embodiment, the bezel 31 may be detachably coupled to the housing cover 32. In an embodiment, the bezel 31 may form a receiving space in which components constituting the electronic device 1, such as the display panel 10 and the chassis 20, are disposed when coupled to the housing cover 32. In an embodiment, the housing cover 32 may form a rear portion of the electronic device 1. In an embodiment, the housing cover 32 may be configured to surround the chassis 20 on one side (e.g., the rear) of the chassis 20. An example is shown and described herein in which the electronic device 1 includes the bezel 31 for the display panel 10, but the disclosed embodiments are not limited thereto.

Figure 3:
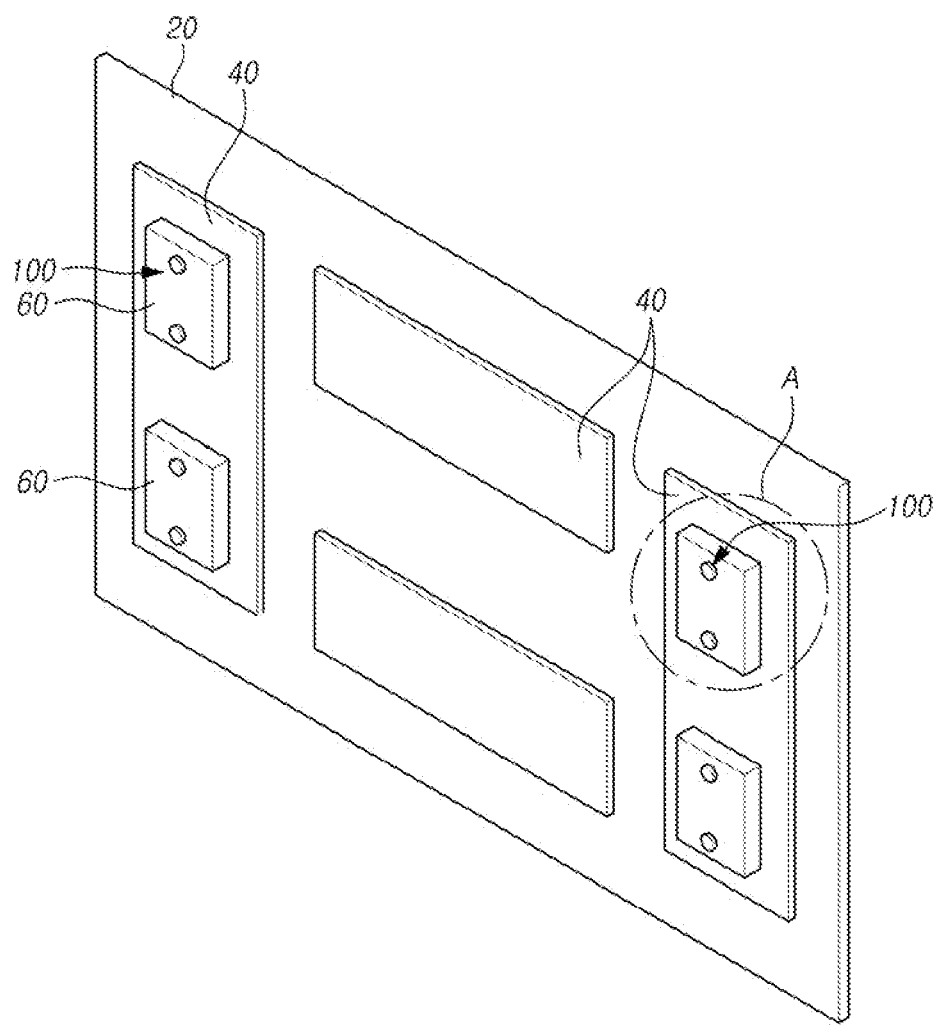
FIG. 3 is a perspective view illustrating a combination of a heat sink, a PCB, and a chassis according to an embodiment.
Figure 4:
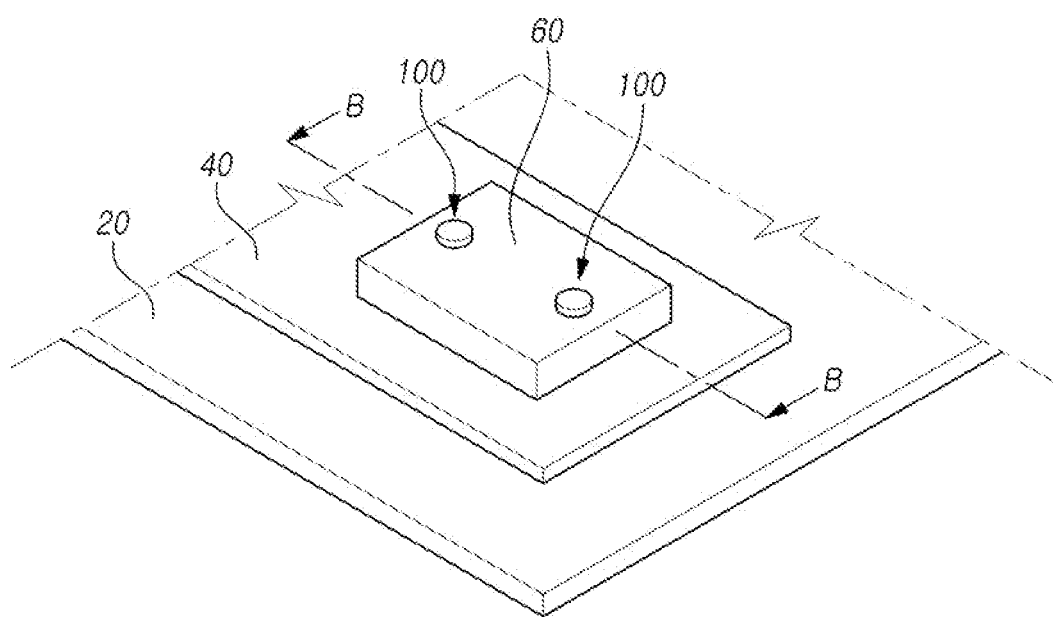
FIG. 4 is an enlarged view of portion A of FIG. 3.

FIG. 3 is a perspective view illustrating a combination of a heat sink, a PCB, and a chassis according to an embodiment. FIG. 4 is an enlarged view of portion A of FIG. 3.

Referring to FIGS. 3 and 4, in an embodiment, an electronic device (e.g., the electronic device 1 of FIG. 1) may include a chassis 20, a PCB 40, and a heat sink 60.

According to an embodiment, the PCB 40 may be disposed on one surface (e.g., an upper surface) of the chassis 20. In an embodiment, a plurality of PCBs 40 may be provided. The plurality of PCBs 40 may be disposed to be spaced apart from each other on one surface of the chassis 20.

According to an embodiment, a plurality of circuit elements may be disposed on one surface (e.g., an upper surface) of each PCB 40. In an embodiment, the circuit element may be implemented by various electrical elements, metal boards, and/or wiring patterns disposed on the PCB 40.

According to an embodiment, the heat sink 60 may be configured to dissipate heat generated by the circuit element to the outside to prevent overheating. The heat sink 60 may be formed of, e.g., a material such as a metal having excellent thermal conductivity. In an embodiment, the heat sink 60 may be disposed on the PCB 40 and the circuit element. In an embodiment, the heat sink 60 may be provided to cover the circuit element. The heat sink 60 may be designed to be larger than, e.g., the area of the circuit element. In an embodiment, although not specifically shown, the heat sink 60 may include a base (not shown) in contact with the circuit element, and a plurality of heat dissipation fins (not shown) formed to protrude vertically at a predetermined interval from the base to dissipate heat through convection of air.

According to an embodiment, the electronic device 1 may include a fastening structure 100 configured to directly connect the chassis 20, the PCB 40, and the heat sink 60. In an embodiment, the fastening structure 100 may pass through the chassis 20, the PCB 40, and the heat sink 60 in one direction to couple the chassis 20, the PCB 40, and the heat sink 60. The PCB 40 and the heat sink 60 may be fixed and supported on the chassis 20 by the fastening structure 100. The fastening structure 100 may be an integrated fastening structure and may be referred to as a fastening pin 100. Hereinafter, a specific structure and shape of the fastening pin is described below.

Figure 5:
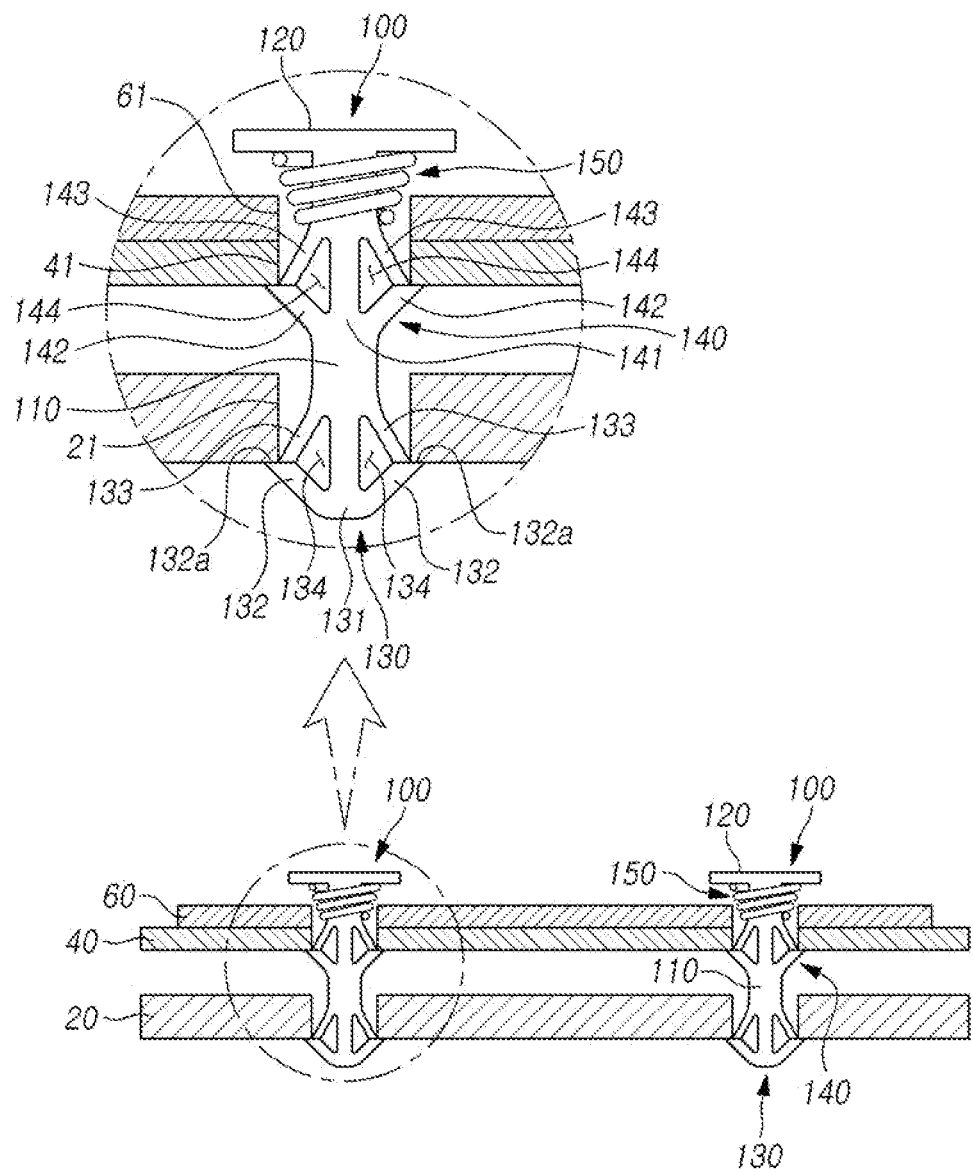
FIG. 5 is a cross-sectional view taken along line B-B of FIG. 4, illustrating a state in which a heat sink, a PCB, and a chassis are fastened through an integrated fastening structure having a unidirectional structure according to an embodiment.

FIG. 5 is a cross-sectional view taken along line B-B of FIG. 4, illustrating a state in which a heat sink, a PCB, and a chassis are fastened by an integrated fastening structure according to an embodiment.

Referring to FIG. 5, in an embodiment, the fastening pin 100 may be configured to pass through and integrally and directly connect the chassis 20, the PCB 40, and the heat sink 60. In an embodiment, a plurality of fastening pins 100 may be provided.

In an embodiment, the chassis 20 may be provided with at least one chassis hole 21 into which the fastening pin 100 is inserted. In an embodiment, the chassis hole may have a through hole structure that passes through the chassis 20. For example, when the chassis 20 is thick, the chassis hole may have a recess shape with a hole (e.g., a blind hole) to which the fastening pin 100 is fitted, rather than a through hole passing through the chassis 20. In an embodiment, the PCB 40 may be provided with at least one PCB hole 41 through which the fastening pin 100 passes. In an embodiment, the heat sink 60 may be provided with at least one heat sink hole 61 through which the fastening pin 100 passes. In an embodiment, the chassis hole 21, the PCB hole 41, and the heat sink hole 61 may be disposed to communicate with each other. The chassis hole 21, the PCB hole 41, and the heat sink hole 61 may be formed at positions corresponding to the chassis 20, the PCB 40, and the heat sink 60, respectively. The chassis hole 21, the PCB hole 41, and the heat sink hole 61 may be configured to have shapes corresponding to each other.

According to an embodiment, the fastening pin 100 may include a body portion 110, a stopper portion 120, a first engagement portion 130, a second engagement portion 140, and an elastic member 150.

According to an embodiment, the body portion 110 may extend in the vertical direction. According to an embodiment, the body portion 110 may be formed to have a substantially shaft shape (e.g., a cylindrical shape). In an embodiment, the body portion 110 may be formed to have a smaller diameter than the chassis hole 21, the PCB hole 41, and the heat sink hole 61, but is not limited thereto.

According to an embodiment, the stopper portion 120 may extend from one end (e.g., the upper end) of the body portion 110 in a direction perpendicular to the length direction (e.g., the vertical direction) of the body portion 110. In an embodiment, the stopper portion 120 may be formed to have a substantially disk shape. The stopper portion 120 may be formed to have a larger diameter than, e.g., the chassis hole 21, the PCB hole 41, and the heat sink hole 61. In this case, when the fastening pin 100 passes through, and directly connects, the chassis 20, the PCB 40, and the heat sink 60, the fastening pin 100 may be stuck or fixed on the upper surface of the heat sink 60 by the stopper portion 120 to be prevented from further moving in the fastening direction and may thus be prevented from escaping off the passed-through objects (e.g., the chassis 20, the PCB 40, and the heat sink 60).

According to an embodiment, the first engagement portion 130 may be configured such that the fastening pin 100 is stuck and fixed to the chassis 20. For example, the first engagement portion 130 may be disposed to be stuck or engaged through the chassis hole 21 to the bottom of the chassis 20. In an embodiment, the first engagement portion 130 may be disposed under the body portion 110.

In an embodiment, the first engagement portion 130 may include a first center portion 131, a first engagement protrusion 132, a first reinforcing portion 133, and a first elastic space 134.

According to an embodiment, the first center portion 131 may extend from a lower end portion of the body portion 110 to two opposite sides.

According to an embodiment, a pair of first engagement protrusions 132 may be provided. The pair of first engagement protrusions 132 may be symmetrically formed with respect to the first center portion 131 or the body portion 110.

According to an embodiment, the pair of first engagement protrusions 132 may be configured to be elastically deformable in a direction closer to the body 110 in response to an external force applied in a direction perpendicular to the body 110. The pair of first engagement protrusions 132 may be formed to extend toward the upper portion of the body portion 110 from two opposite ends of the first center portion 131 and inclined away from the body portion 110. As one surface 132a (e.g., engagement surface) contacts the lower surface adjacent to the chassis hole 21 of the chassis 20 when the fastening pin 100 is fastened to the chassis 20, PCB 40, and heat sink 60, the pair of first engagement protrusions 132 may allow the fastening pin 100 to be stuck and fixed to the chassis 20. For example, when the fastening pin 100 is pushed to allow the pair of first engagement protrusions 132 to pass through the chassis hole 21 from the upper side of the chassis 20 to the lower side, the first engagement protrusion 132 passes through the chassis hole 21 while being temporarily deformed to approach the body portion 110 by the force applied to the first engagement protrusion 132 (i.e., the force toward the body portion 110 in the center of the chassis hole 21) by the chassis hole 21. After passing through the chassis hole 21, each of the pair of first engagement protrusions 132 may be restored to its original state and may be stuck or engaged to the chassis hole 21 by, e.g., the engagement surface. As described above, because the pair of first engagement protrusions 132 extend inclined away from the body portion 110, even when the fastening pin 100 is pulled in a direction opposite to the pushing direction, the pair of first engagement protrusions 132 may remain fixed without exiting the chassis hole 21. As described above, such a structure of the fastening pin 100 in which the fastening pin 100 is pushed in one direction to fasten the chassis 20, the PCB 40, and heat sink 60, and after fastening, remains fixed not to be pulled out in the opposite direction is referred to as a fixed type.

According to an embodiment, there may be provided a pair of first reinforcing portions 133. The pair of first reinforcing portions 133 may be symmetrically formed with respect to the first center portion 131 or the body portion 110.

According to an embodiment, the first reinforcing portion 133 may be configured to be elastically deformable in a direction closer to the body portion 110 in response to an external force applied in a direction perpendicular to the body portion 110. The pair of first reinforcing portions 133 may be formed to extend toward the lower portion of the body portion 110 from two opposite ends of the body portion 110 and inclined away from the body portion 110. In an embodiment, the pair of first reinforcing portions 133 may be connected to the pair of first engagement protrusions 132, respectively. Each of the pair of first reinforcing portions 133 may be connected to, e.g., the first engagement protrusion 132 at an inner point close to the body portion 110 on one surface 132a of the first engagement protrusion 132. The pair of first reinforcing portions 133 may be formed to have a thickness smaller than that of the pair of first engagement protrusions 132. In this case, at least one point or a portion of one surface 132a of the pair of first engagement protrusions 132 may be stuck or engaged to the chassis hole 21.

According to an embodiment, the first elastic space 134 may be defined by the first engagement protrusion 132, the first reinforcing portion 133, and the body portion 110. The first elastic space 134 may mean a space positioned between the first engagement protrusion 132, the first reinforcing portion 133, and the body portion 110 and surrounded by the components 131, 132, and 110. In an embodiment, the first elastic space 134 may correspond to a space in which, when the fastening pin 100 is fastened to the chassis 20, the PCB 40, and the heat sink 60, the first engagement protrusion 132 and the first reinforcing portion 133 are elastically deformed in a direction closer to the body portion 110 in response to the external force applied in a vertical direction of the body 110.

According to an embodiment, the second engagement portion 140 may be provided such that the fastening pin 100 is stuck and fixed to the PCB 40 and the heat sink 60. For example, the second engagement portion 140 may be disposed to be stuck or engaged through the PCB hole 41 to the bottom of the PCB 40. In an embodiment, the second engagement portion 140 may be disposed on the first engagement portion 130 along the body portion 110. The second engagement portion 140 may be disposed between the stopper portion 120 and the first engagement portion 130.

In an embodiment, the second engagement portion 140 may include a second center portion 141, a second engagement protrusion 142, a second reinforcing portion 143, and a second elastic space 144. In an embodiment, the second engagement portion 140 may be configured to substantially correspond to the first engagement portion 130 in terms of operation, shape, and structure. In this case, the description of the first center portion 131, the first engagement protrusion 132, and the first reinforcing portion 133 of the first engagement portion 130 may be equally applied to each of the second center portion 141, the second engagement protrusion 142, the second reinforcing portion 143, and the second elastic space 144 of the second engagement portion 140.

According to an embodiment, the elastic member 150 may be disposed on the second engagement portion 140 along the body portion 110. The elastic member 150 may be disposed to surround, e.g., the body portion 110 at a point positioned between the stopper portion 120 and the second engagement portion 140. In an embodiment, the elastic member 150 may extend in the vertical direction to have a substantially helical shape. The elastic member 150 may be formed to gradually decrease in diameter from an upper portion to lower portion of the body portion 110. The maximum diameter of the elastic member 150 may be set to be greater than the diameter of the heat sink hole 61 and less than the diameter of the stopper portion 120. In this case, when the fastening pin 100 is fastened to the chassis 20, the PCB 40, and the heat sink 60, the elastic member 150 may apply an elastic force to the fastening pin 100 in a direction opposite to the fastening direction of the fastening pin 100 to bring the engagement portions 130 and 140 into tight contact with the chassis 20, the PCB 40, and the heat sink 60, thereby enhancing the fastening force between the fastening pin 100 and the chassis 20, the PCB 40, and the heat sink 60.

In an embodiment, two elastic members 150 may be included in the fastening pins 100. In this case, one elastic member 150 may be disposed between the stopper portion 120 and the second engagement portion 140 as described above, and the other elastic member 150 may be disposed between the second engagement portion 140 and the first engagement portion 130.

Figure 6:
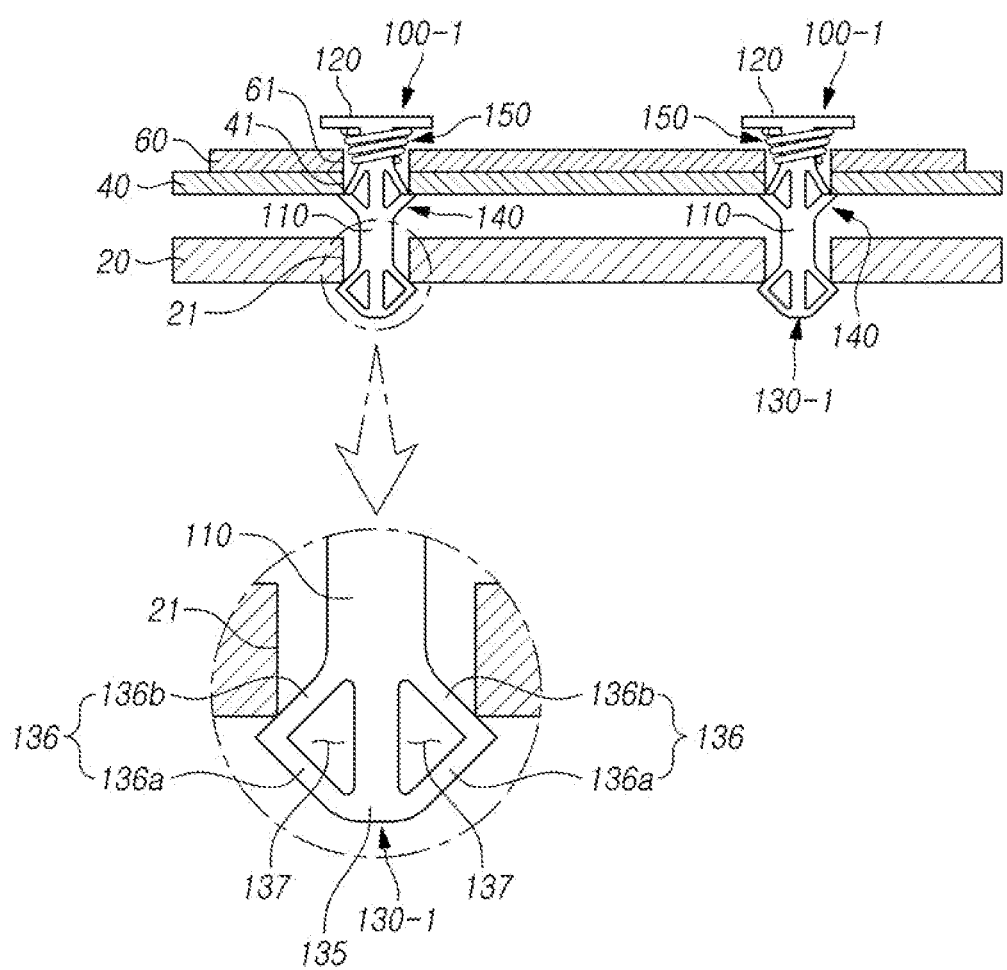
FIG. 6 is a cross-sectional view taken along line B-B of FIG. 4, illustrating a state in which a heat sink, a PCB, and a chassis are fastened through an integrated fastening structure having a unidirectional structure according to an embodiment.

FIG. 6 is a cross-sectional view taken along line B-B of FIG. 4, illustrating a state in which a heat sink, a PCB, and a chassis are fastened through an integrated fastening structure according to an embodiment.

Comparison between FIG. 6 and FIG. 5 reveals that the first engagement portion 130-1 of the fastening pin 100-1 shown in FIG. 6 differs from the first engagement portion 130 of the fastening pin 100 of FIG. 5 in operation, shape, and structure, and FIGS. 5 and 6 may substantially correspond to each other in the other components. In describing the fastening pin 100-1 with reference to FIG. 6, the same reference numerals are assigned to components corresponding to the fastening pin 100 described above, and detailed descriptions thereof will be omitted. Hereinafter, the first engagement portion 130-1 of FIG. 6 is mainly described.

Referring to FIG. 6, in an embodiment, the first engagement portion 130-1 may be configured to have a rhombus shape having a diagonal line portion of the body 110 near a lower end of the body portion 110.

In an embodiment, the first engagement portion 130-1 may include a first center portion 135, a first engagement protrusion 136, and a first elastic space 137.

According to an embodiment, the first center portion 135 may extend from a lower end portion of the body portion 110 to two opposite sides.

According to an embodiment, a pair of first engagement protrusions 136 may be provided. The pair of first engagement protrusions 136 may be symmetrically formed with respect to the body portion 110.

According to an embodiment, the pair of first engagement protrusions 136 may be configured to be elastically deformable in a direction closer to the body 110 in response to an external force applied in a direction perpendicular to the body 110. In an embodiment, the respective lower portions 136a of the pair of first engagement protrusions 136 may be formed to extend toward the upper portion of the body portion 110 from two opposite ends of the first center portion 131 and inclined away from the body portion 110. In an embodiment, the respective upper portions 136b of the pair of first engagement protrusions 136 may be formed to extend toward the lower portion of the body portion 110 from two opposite sides of the body portion 110 and inclined away from the body portion 110. In this case, as the upper portion 136b contacts the lower surface adjacent to the chassis hole 21 of the chassis 20 when the fastening pin 100-1 is fastened to the chassis 20, PCB 40, and heat sink 60, the pair of first engagement protrusions 136 may allow the fastening pin 100-1 to be stuck and fixed to the chassis 20. Further, even after the fastening pin 100-1 is fastened to the chassis 20, the fastening pin 100-1 may be separated from the chassis 20 by applying an external force to the fastening pin 100-1 in a direction opposite to the fastening direction of the fastening pin 100-1.

For example, when the fastening pin 100-1 is pushed to allow the pair of first engagement protrusions 136 to pass through the chassis hole 21 from the upper side of the chassis 20 to the lower side, the first engagement protrusion 136 passes through the chassis hole 21 while being temporarily deformed to approach the body portion 110 by the force applied to the lower portion 136a of the first engagement protrusion 136 (i.e., the force toward the body portion 110 in the center of the chassis hole 21) which is brought in contact with the chassis hole 21 by the chassis hole 21. After passing through the chassis hole 21, each of the pair of first engagement protrusions 136 may be restored to its original state and may be stuck or engaged to the chassis hole 21 by the upper portion 136b of the first engagement protrusion 136. As described above, because the upper portion 136b of the pair of first engagement protrusions 136 has a shape symmetrical to the lower portion 136a, when the fastening pin 100-1 is pulled in a direction opposite to the pushing direction, an external force may be applied to the upper portion 136a of the pair of first engagement protrusions 136, and the first engagement protrusion 136 may exit the chassis hole 21. As described above, such a structure of the fastening pin 100-1 in which the fastening pin 100-1 is pushed in one direction to fasten the chassis 20, the PCB 40, and heat sink 60 and after fastening, be pulled out in the opposite direction to disengage is referred to as a detachable type.

According to an embodiment, the first elastic space 137 may be defined by the first engagement protrusion 136 and the body portion 110. The first elastic space 137 may mean a space positioned between the first engagement protrusion 136 and the body portion 110 and surrounded by the components 137 and 110. In an embodiment, the first elastic space 137 may correspond to a space in which, when the fastening pin 100 is fastened to the chassis 20, the PCB 40, and the heat sink 60, the first engagement protrusion 136 is elastically deformed in a direction closer to the body portion 110 in response to the external force applied in a vertical direction of the body 110.

Figure 7:
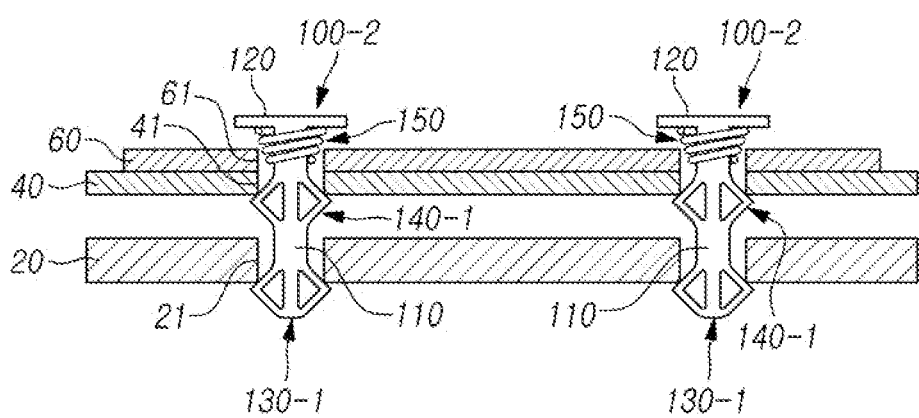
FIG. 7 is a cross-sectional view taken along line B-B of FIG. 4, illustrating a state in which a heat sink, a PCB, and a chassis are fastened through an integrated fastening structure having a unidirectional structure according to an embodiment.

FIG. 7 is a cross-sectional view taken along line B-B of FIG. 4, illustrating a state in which a heat sink, a PCB, and a chassis are fastened through an integrated fastening structure according to an embodiment.

Comparison between FIG. 7 and FIG. 6 reveals that the second engagement portion 140-1 of the fastening pin 100-2 shown in FIG. 7 differs from the second engagement portion 140 of the fastening pin 100-1 of FIG. 6 in operation, shape, and structure, and FIGS. 6 and 6 may substantially correspond to each other in the other components. Further, the second engagement portion 140-1 of FIG. 7 may be configured to substantially correspond to the first engagement portion 130-1 illustrated in FIG. 6.

The first engagement portion 130-1 may be configured to have, e.g., a rhombus shape having a diagonal line portion of the body portion 110 near a lower end of the body portion 110, and the second engagement portion 140-1 may be configured to have, e.g., a rhombus shape having a diagonal line portion of the body portion 110 near an upper end of the body portion 110. In this case, even after the fastening pin 100-2 is fastened to the chassis 20, PCB 40, ad heat sink 60, the fastening pin 100-2 may be separated from the components 20, 40, and 60 by applying an external force to the fastening pin 100-2 in a direction opposite to the fastening direction of the fastening pin 100-2.

Figure 8A:
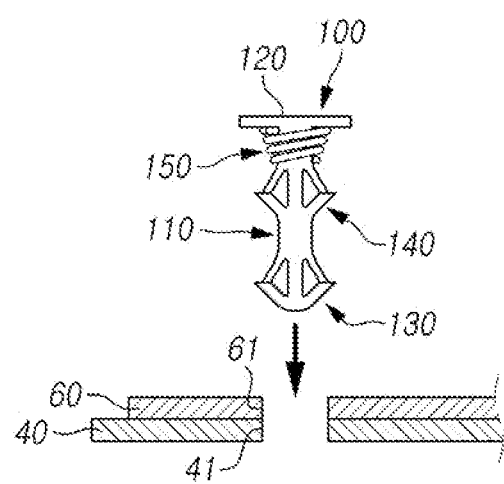
FIG. 8A is an operation view illustrating a fastening process of an integrated structure having a unidirectional direction according to an embodiment.
Figure 8B:
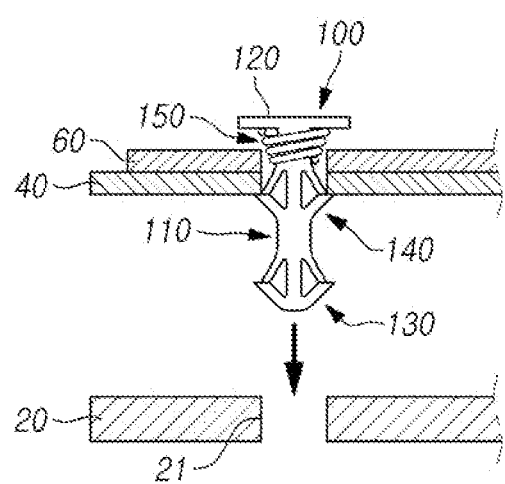
FIG. 8B is an operation view illustrating a fastening process of an integrated structure having a unidirectional direction according to an embodiment.
Figure 8C:
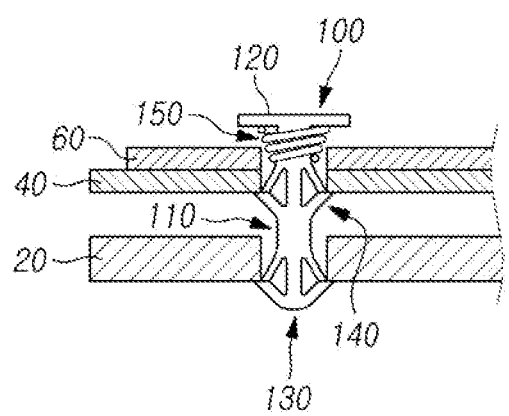
FIG. 8C is an operation view illustrating a fastening process of an integrated structure having a unidirectional direction according to an embodiment.

FIGS. 8a to 8c depict an operational flow view illustrating a fastening process of an integrated structure having a unidirectional direction according to an embodiment.

Referring to FIG. 8, a fastening operation of the integrated structure (or fastening pin) 100 having a unidirectional structure, the chassis 20, the PCB 40, and the heat sink 60 is described. The unidirectional structure may mean a structure in which the fastening pin 100 is inserted into the holes 21, 41, and 61 provided in the chassis 20, the PCB 40, and the heat sink 60 in one direction (e.g., the upper side) to directly connect the chassis 20, the PCB 40, and the heat sink 60.

As illustrated in views FIGS. 8a and 8b, the heat sink 60 is positioned on the PCB 40 to match the positions of the PCB hole 41 of the PCB 40 and the heat sink hole 61 of the heat sink 60, and then the fastening pin 100 is pushed downward from the upper side of the heat sink 60 to insert the first and second engagement portions 130 and 140 into the PCB hole 41 and the heat sink hole 61. In this case, each of the first engagement portion 130 and the second engagement portion 140 is elastically deformed to approach the body portion 110 by an external force applied as the first engagement portion 130 and the second engagement portion 140 contact the PCB 40 or the heat sink 60 during insertion and sequentially passes through the heat sink hole 61 and the PCB hole 41. Thereafter, as the second engagement portion 140 passing through the PCB hole 41 is restored to its original state and is stuck and fixed to the PCB 40, the PCB 40 and the heat sink 60 are fixedly coupled to each other by the fastening pin 100.

Thereafter, as illustrated in views FIGS. 8b and 8c, the first engagement portion 130 is inserted into the chassis hole 21 of the chassis 20 by pushing the fastening pin 100 downward from the upper side of the chassis 20, and the first engagement portion 130 is elastically deformed to approach the body portion 110 by an external force applied as the first engagement portion 130 contacts the chassis 20 during the insertion and passes through the chassis hole 21. Thereafter, as the first engagement portion 130 passing through the chassis hole 21 is restored to its original state and is stuck and fixed to the chassis 20, the chassis 20, the PCB 40, and the heat sink 60 are directly connected by the fastening pin 100, which is a fastening structure.

Figure 9:
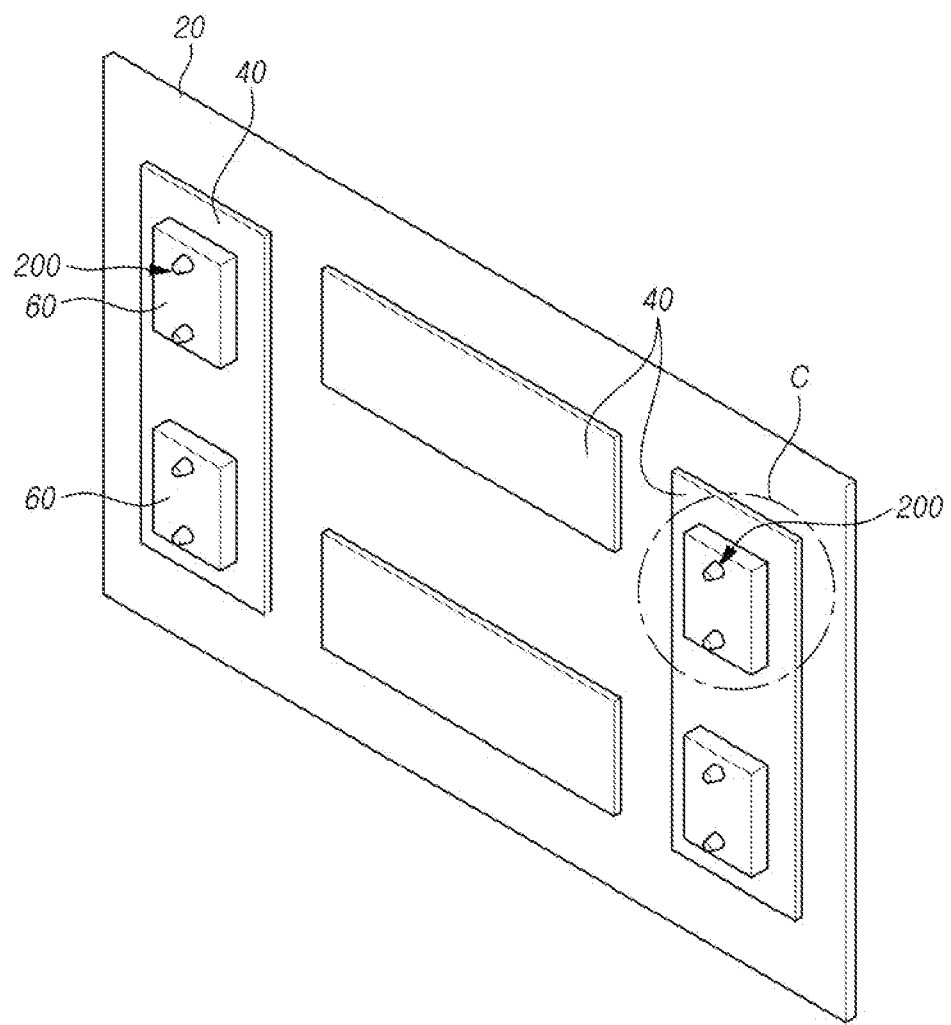
FIG. 9 is a perspective view illustrating a combination of a heat sink, a PCB, and a chassis according to an embodiment.
Figure 10:
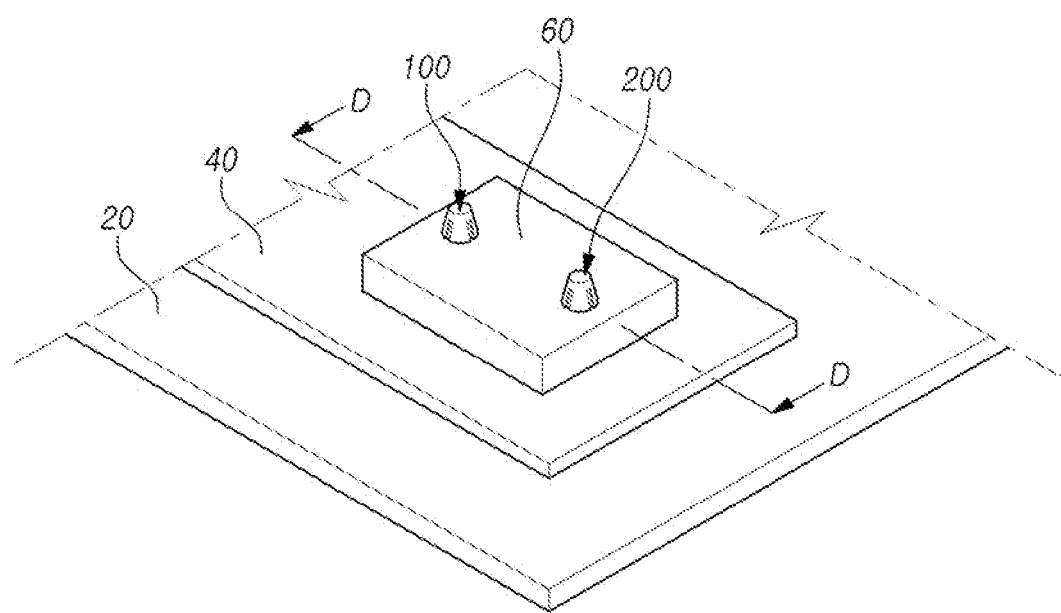
FIG. 10 is an enlarged view of portion C of FIG. 9.

FIG. 9 is a perspective view illustrating a combination of a heat sink, a PCB, and a chassis according to an embodiment. FIG. 10 is an enlarged view of portion C of FIG. 9.

According to an embodiment, the electronic device (e.g., the electronic device 1 in FIG. 1) may include a fastening structure 200 (e.g., a fastening pin) configured to directly connect the chassis 20, the PCB 40, and the heat sink 60. In an embodiment, the fastening pin 200 may pass through at least one of the chassis 20, the PCB 40, and the heat sink 60 on one side to fix the PCB 40 and the heat sink 60 to the chassis 20. In this case, the PCB 40 and the heat sink 60 may be fixed and supported on the chassis 20 by the fastening pin 200. Although not specifically illustrated, the fastening pin 200 illustrated in FIG. 10 may be configured to have a bidirectional integrated fastening structure in both directions, unlike the fastening pin 200 having a unidirectional integrated fastening structure illustrated in FIG. 4. Hereinafter, the bidirectional integrated fastening structure of the fastening pin 100 is described.

Figure 11:
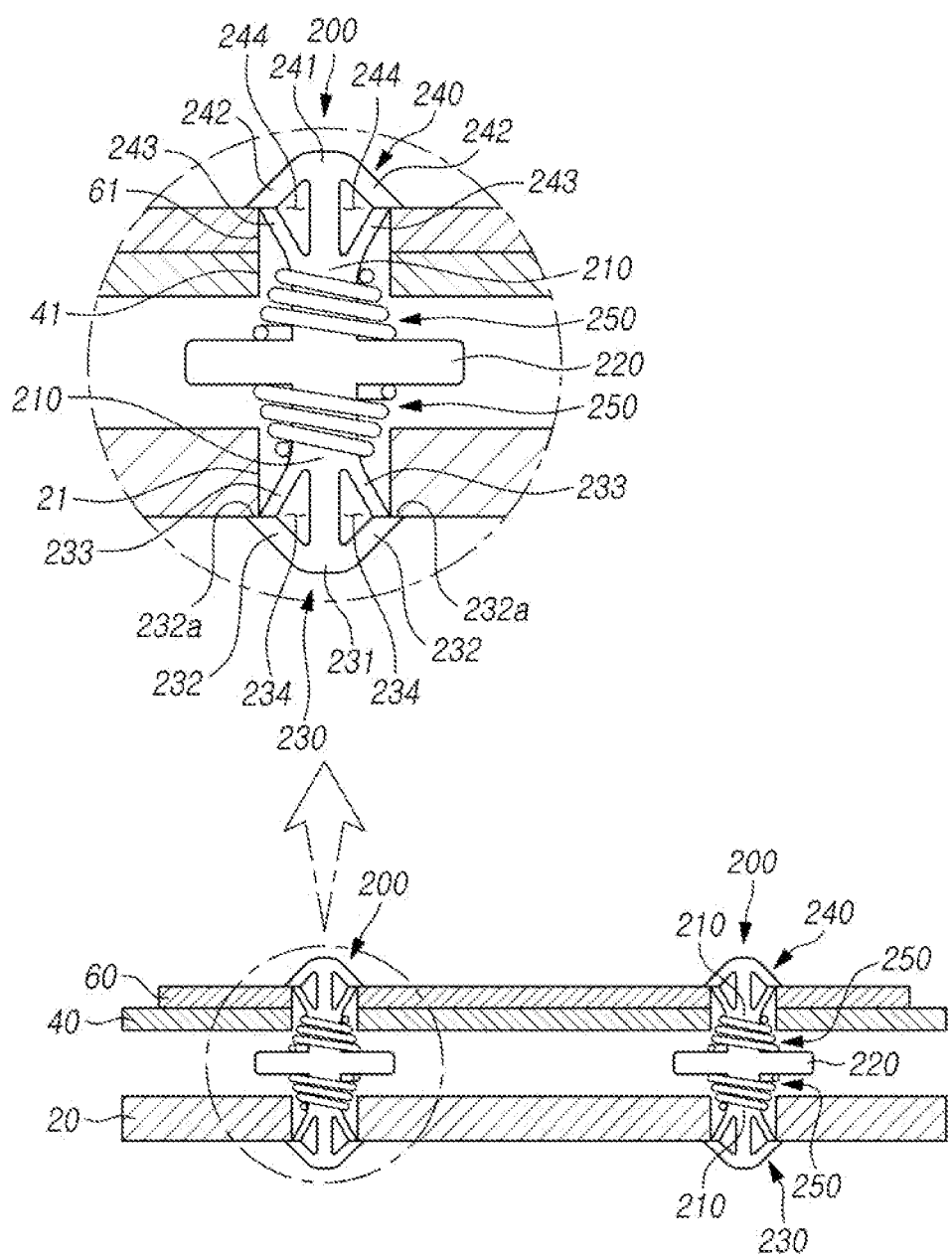
FIG. 11 is a cross-sectional view taken along line D-D of FIG. 10, illustrating a state in which a heat sink, a PCB, and a chassis are fastened through an integrated fastening structure having a bidirectional structure according to an embodiment.

FIG. 11 is a cross-sectional view taken along line D-D of FIG. 10, illustrating a state in which a heat sink, a PCB, and a chassis are fastened through an integrated fastening structure according to an embodiment.

Referring to FIG. 11, according to an embodiment, the fastening pin 200 may include a body portion 210, a stopper portion 220, a first engagement portion 230, a second engagement portion 240, and an elastic member 250.

According to an embodiment, the body portion 210 may extend in the vertical direction. According to an embodiment, the body portion 110 may be formed to have a substantially shaft shape (e.g., a cylindrical shape). In an embodiment, the body portion 210 may be formed to have a smaller diameter than the chassis hole 21, the PCB hole 41, and the heat sink hole 61, but is not limited thereto.

According to an embodiment, the stopper portion 220 may extend from the center portion of the body portion 210 in a direction perpendicular to the length direction (e.g., the vertical direction) of the body portion 210. In an embodiment, the stopper portion 220 may be disposed between the first engagement portion 230 and the second engagement portion 240. In an embodiment, the stopper portion 220 may be formed to have a substantially disk shape. The stopper portion 220 may be formed to have a larger diameter than, e.g., the chassis hole 21, the PCB hole 41, and the heat sink hole 61. In this case, when the fastening pin 200 passes through, and directly connects, the chassis 20, the PCB 40, or the heat sink 60, the fastening pin 200 may be stuck or fixed to any one of the chassis 20, PCB 40, or heat sink 60 by the stopper portion 120 to be prevented from further moving in the fastening direction and may thus be prevented from escaping off the passed-through objects (e.g., the chassis 20, the PCB 40, and the heat sink 60).

According to an embodiment, the first engagement portion 230 may be disposed under the stopper portion 220. In an embodiment, the first engagement portion 230 may include a first center portion 231, a first engagement protrusion 232, a first reinforcing portion 233, and a first elastic space 234.

The first engagement portion 230 illustrated in FIG. 11 may be configured to substantially correspond to the first engagement portion 130 illustrated in FIG. 5 in terms of operation, shape, and structure. Accordingly, the description of the first center portion 131, the first engagement protrusion 132, the first reinforcing portion 133, and the first elastic space 134 of the first engagement portion 130 illustrated in FIG. 4 may be equally applied to each of the first center portion 231, the first engagement protrusion 232, the first reinforcing portion 233, and the first elastic space 234 of the first engagement portion 230.

In an embodiment, when the fastening pin 200 is pushed to allow the pair of first engagement protrusions 232 to pass through the chassis hole 21 from the upper side of the chassis 20 to the lower side, the first engagement protrusion 232 passes through the chassis hole 21 while being temporarily deformed to approach the body portion 210 by the force applied to the first engagement protrusion 122 (i.e., the force toward the body portion 210 in the center of the chassis hole 21) by the chassis hole 21. After passing through the chassis hole 21, each of the pair of first engagement protrusions 232 may be restored to its original state and may be stuck to the chassis hole 21 by, e.g., the engagement surface 232a. Because the pair of first engagement protrusions 232 extend inclined away from the body portion 210, even when the fastening pin 200 is pulled in a direction opposite to the pushing direction, the pair of first engagement protrusions 232 may remain fixed without exiting the chassis hole 21.

According to an embodiment, the second engagement portion 240 may be disposed above the stopper portion 220. In an embodiment, the second engagement portion 240 may include a second center portion 241, a second engagement protrusion 242, a second reinforcing portion 243, and a second elastic space 244. In an embodiment, as illustrated in FIG. 11, the second engagement portion 240 may be configured to be symmetrical to the first engagement portion 230 with respect to the stopper portion 220 in terms of operation, shape, and structure. In this case, the description of the first center portion 231, the first engagement protrusion 232, the first reinforcing portion 233, and the first elastic space 234 of the first engagement portion 230 may be equally applied to each of the second center portion 241, the second engagement protrusion 242, the second reinforcing portion 243, and the second elastic space 244 of the second engagement portion 240 except that they are vertically inverted in structure with respect to the stopper portion 220.

In this case, as the first engagement portion 230 and the second engagement portion 240 are disposed on the upper side and the lower side, respectively, of the stopper portion 220, the fastening pin 200 may directly connect the chassis 20, the PCB 40, or the heat sink 60 in two opposite directions (e.g., the upper side or the lower side) as the fastening direction.

According to an embodiment, the elastic member 250 may be disposed on at least one of an upper side or a lower side of the stopper portion 220. The elastic member 250 may be disposed, e.g., between the first engagement portion 230 and the stopper portion 220. The elastic member 250 may be disposed, e.g., between the second engagement portion 240 and the stopper portion 220. In an embodiment, the elastic member 150 may extend in the vertical direction to have a substantially helical shape. In an embodiment, the elastic member 250 (e.g., the first elastic member) disposed under the stopper portion 220 may be formed such that a diameter thereof gradually decreases from the stopper portion 220 toward a lower portion of the body portion 210. In an embodiment, the elastic member 250 (e.g., the second elastic member) disposed on the stopper portion 220 may be formed such that a diameter thereof gradually decreases from the stopper portion 220 toward an upper portion of the body portion 210.

Figure 12:
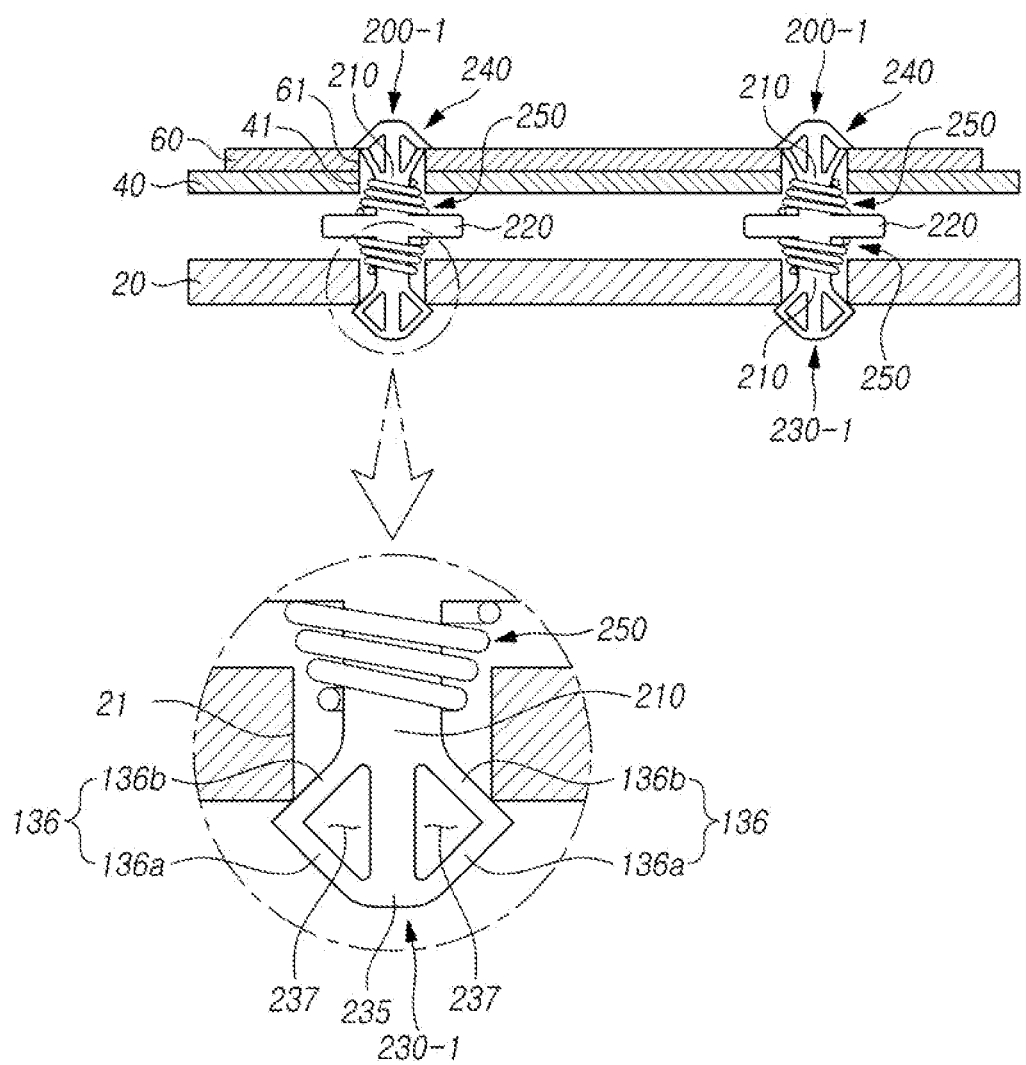
FIG. 12 is a cross-sectional view taken along line D-D of FIG. 10, illustrating a state in which a heat sink, a PCB, and a chassis are fastened through an integrated fastening structure having a bidirectional structure according to an embodiment.

FIG. 12 is a cross-sectional view taken along line D-D of FIG. 10, illustrating a state in which a heat sink, a PCB, and a chassis are fastened through an integrated fastening structure according to an embodiment.

Comparison between FIG. 12 and FIG. 11 reveals that the first engagement portion 230-1 of the fastening pin 200-1 shown in FIG. 12 differs from the first engagement portion 230 of FIG. 11 in operation, shape, and structure, and FIGS. 12 and 11 may substantially correspond to each other in the other components. In describing the fastening pin 200-1 with reference to FIG. 12, the same reference numerals are assigned to components corresponding to the fastening pin 200 described above, and detailed descriptions thereof will be omitted.

In an embodiment, the first engagement portion 230-1 may include a first center portion 235, a first engagement protrusion 236, and a first elastic space 237. The first engagement portion 230-1 of FIG. 12 may be configured to substantially correspond to the first engagement portion 130-1 of FIG. 6 in operation, shape, and structure. In this case, the description of the first center portion 135, the first engagement protrusion 136, and the first elastic space 137 of the first engagement portion 130-1 of FIG. 6 may be equally applied to each of the first center portion 235, the first engagement protrusion 236, and the first elastic space 237 of the first engagement portion 230-1 of FIG. 12.

Figure 13:
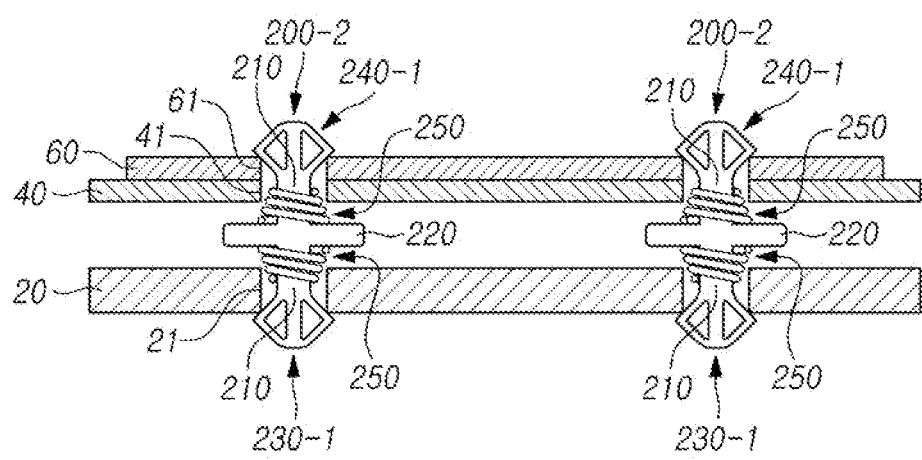
FIG. 13 is a cross-sectional view taken along line D-D of FIG. 10, illustrating a state in which a heat sink, a PCB, and a chassis are fastened through an integrated fastening structure having a bidirectional structure according to an embodiment.

FIG. 13 is a cross-sectional view taken along line D-D of FIG. 10, illustrating a state in which a heat sink, a PCB, and a chassis are fastened through an integrated fastening structure according to an embodiment.

Comparison between FIG. 13 and FIG. 12 reveals that the second engagement portion 240-1 of the fastening pin 200-2 shown in FIG. 13 differs from the second engagement portion 240 of the fastening pin 200-1 of FIG. 12 in operation, shape, and structure, and FIGS. 13 and 12 may substantially correspond to each other in the other components.

Further, as illustrated in FIG. 13, the second engagement portion 240-1 may be configured to be symmetrical to the first engagement portion 230-1 with respect to the stopper portion 220 in terms of operation, shape, and structure. In this case, the description of the first engagement portion 230-1 may be equally applied to the second engagement portion 240-1 except that the structure thereof is vertically inverted with respect to the stopper portion 220.

In this case, even after the fastening pin 200-2 is fastened to the chassis 20, PCB 40, ad heat sink 60, the fastening pin 200-2 may be separated from the components 20, 40, and 60 by applying an external force to the fastening pin 200-2 in a direction opposite to the fastening direction of the fastening pin 200-2.

Figure 14A:
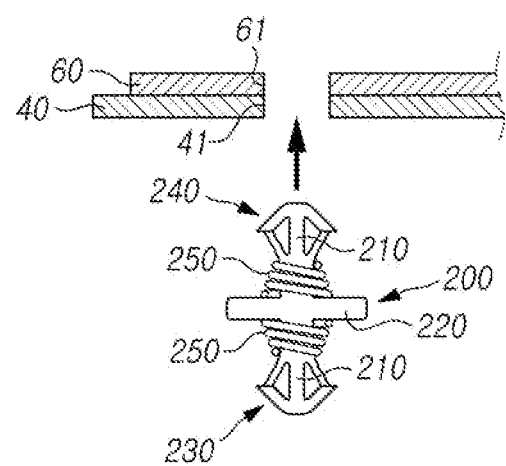
FIG. 14A is an operation view illustrating a fastening process of an integrated structure having a bidirectional direction according to an embodiment.
Figure 14B:
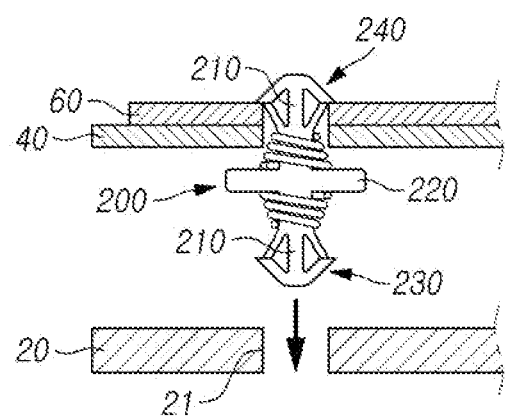
FIG. 14B is an operation view illustrating a fastening process of an integrated structure having a bidirectional direction according to an embodiment.
Figure 14C:
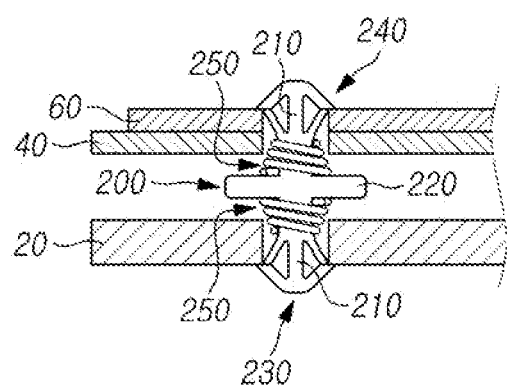
FIG. 14C is an operation view illustrating a fastening process of an integrated structure having a bidirectional direction according to an embodiment.

FIG. 14 is an operation view illustrating a fastening process of an integrated structure having a bidirectional direction according to an embodiment.

Referring to FIG. 14, a fastening operation of the integrated structure 200 having a bidirectional structure, the chassis 20, the PCB 40, and the heat sink 60 is described. The bidirectional structure may refer to, e.g., a structure in which the fastening pin 200 is inserted into the holes 41 and 61 provided in the PCB 40 and the heat sink 60 on one side (e.g., the upper side), and the fastening pin 200 is inserted into the hole 21 provided in the chassis 20 on the other side (e.g., the lower side) to directly connect the chassis 20, the PCB 40, and the heat sink 60.

As illustrated in views FIGS. 14a and 14b, the heat sink 60 is positioned on the PCB 40 to match the positions of the PCB hole 41 of the PCB 40 and the heat sink hole 61 of the heat sink 60, and then the fastening pin 200 is pushed upward from the lower side of the PCB 40 to insert the second engagement portion 240 into the PCB hole 41 and the heat sink hole 61. In this case, the second engagement portion 240 is elastically deformed to approach the body portion 210 by an external force applied as the second engagement portion 240 contacts the PCB 40 or the heat sink 60 during insertion and sequentially passes through the PCB hole 41 and the heat sink hole 61. Thereafter, as the second engagement portion 140 passing through the heat sink hole 61 is restored to its original state and is stuck and fixed to the heat sink 60, the PCB 40 and the heat sink 60 are fixedly coupled to each other by the fastening pin 200.

Thereafter, as illustrated in views FIGS. 8b and 8c, the first engagement portion 230 is inserted into the chassis hole 21 of the chassis 20 by pushing the fastening pin 200 downward from the upper side of the chassis 20, and the first engagement portion 230 is elastically deformed to approach the body portion 210 by an external force applied as the first engagement portion 230 contacts the chassis 20 during the insertion and passes through the chassis hole 21. Thereafter, as the first engagement portion 230 passing through the chassis hole 21 is restored to its original state and is stuck and fixed to the chassis 20, the chassis 20, the PCB 40, and the heat sink 60 are directly connected by one fastening structure.

Such an integrated structure 200 having a bidirectional structure may directly connect the chassis 20, the PCB 40, and the heat sink 60 not only in the above-described fastening operation order but also in the reverse order of the above-described fastening operation order.

Accordingly, as the chassis 20, the PCB 40, and the heat sink 60 may be directly connected to each other through one fastening structure (e.g., the fastening pin 100, 100-1, 100-2, 200, 200-1, or 200-2), the number of fastening members for coupling the structures 20, 40, and 60 may be reduced as compared to the related art. This leads to a reduction in the number of fastening structures (e.g., the fastening holes) for coupling the fastening member, securing a PCB design space, reducing the number of fastening processes, and enhancing the productivity of the electronic device.

The terms as used herein are provided merely to describe some embodiments thereof, but are not intended to limit the disclosed embodiments. As used herein, the singular forms "a," "an," and "the" are intended to include the plural forms as well, unless the context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, the term 'and/of' should be understood as encompassing any and all possible combinations by one or more of the enumerated items. As used herein, the terms "include," "have," and "comprise" are used merely to designate the presence of the feature, component, part, or a combination thereof described herein, but use of the term does not exclude the likelihood of presence or adding one or more other features, components, parts, or combinations thereof. As used herein, the terms "first" and "second" may modify various components regardless of importance and/or order and are used to distinguish a component from another without limiting the components.

As used herein, the terms "configured to" may be interchangeably used with the terms "suitable for," "having the capacity to," "designed to," "adapted to," "made to," or "capable of" depending on circumstances. The term "configured to" does not essentially mean "specifically designed in hardware to." Rather, the term "configured to" may mean that a device can perform an operation together with another device or parts. For example, a 'device configured (or set) to perform A, B, and C' may be a dedicated device to perform the corresponding operation or may mean a general-purpose device capable of various operations including the corresponding operation.

The terms "upper side", "lower side", and "front and rear directions" are defined with respect to the drawings, and the shape and position of each component are not limited by these terms.

The above-described description has been made mainly of specific embodiments, but the disclosure is not limited to such specific embodiments, but should rather be appreciated as covering all various modifications, equivalents, and/or substitutes of various embodiments.

What is claimed is:

1. An electronic device comprising:
   a first structure comprising a first fastening structure;
   a second structure disposed on an upper portion of the first structure and comprising a second fastening structure;
   a third structure disposed on an upper portion of the second structure and comprising a third fastening structure; and
   an integrated fastening structure comprising:
      a shaft extending between a lower end at the first structure and an upper end at the third structure, and
      a first engagement portion and a second engagement portion,
   wherein the integrated fastening structure is configured to directly connect the first structure, the second structure, and the third structure,
   wherein each of the first engagement portion and the second engagement portion is configured to engage a different fastening structure among the first fastening structure, the second fastening structure, and the third fastening structure, and
   wherein at least one of the first engagement portion or the second engagement portion comprises:
      a pair of engagement protrusions extending in a first direction toward an end of the shaft from two opposite sides and inclined away from the shaft, and
      a pair of enforcement protrusions extending in a second direction, opposite to the first direction, toward an opposite end of the shaft from two opposite sides and inclined away from the shaft, the pair of enforcement protrusions being configured to connect to the pair of engagement protrusions.

2. The electronic device of claim 1, wherein the first engagement portion is configured to engage to the first fastening structure on a lower portion of the first structure that is opposite to the upper portion of the first structure, and
   wherein the second engagement portion is configured to engage the second fastening structure on a lower portion of the second structure that is opposite to the upper portion of the second structure or engage the third fastening structure on an upper portion of the third structure.

3. The electronic device of claim 1, wherein the first fastening structure comprises a first hole, the second fastening structure comprises a second hole, and the third fastening structure comprises a third hole, and
   wherein each of the first engagement portion and the second engagement portion is configured to pass through at least one the first hole, the second hole, or the third hole.

4. The electronic device of claim 1, wherein each of the first engagement portion and the second engagement portion is configured to pass through at least one of the first fastening structure, the second fastening structure, and the third fastening structure by elastic deformation.

5. The electronic device of claim 1, wherein the lower end of the shaft is positioned on a lower portion of the first structure that is opposite to the upper portion of the first structure and the upper end of the shaft is positioned on an upper portion of the third structure,
   wherein the first engagement portion comprises:
      a first center portion extending from a position proximal to the lower end of the shaft in a direction perpendicular to an axis of the shaft, and
      a pair of first engagement protrusions extending toward the upper end of the shaft from two opposite sides of the first center portion and inclined away from the shaft, and
   wherein the pair of first engagement protrusions are configured to be elastically deformable in a direction towards the shaft in response to an external force applied in the direction perpendicular to the axis of the shaft.

6. The electronic device of claim 5, wherein the second engagement portion comprises:
   a second center portion extending from a predetermined position that is between the upper end of the shaft and the lower end of the shaft, in the direction perpendicular to the axis of the shaft, and
   a pair of second engagement protrusions extending toward the upper end of the shaft from two opposite sides of the second center portion and inclined away from the shaft, and
   wherein the second engagement protrusions are configured to be elastically deformable in the direction towards the shaft due to the external force applied in the direction perpendicular to the axis of the shaft.

7. The electronic device of claim 5, wherein the second engagement portion comprises:
a second center portion extending from a position proximal to the upper end of the shaft in the direction perpendicular to the axis of the shaft, and
a pair of second engagement protrusions extending toward the lower end of the shaft from two opposite sides of the second center portion and inclined away from the shaft, and
wherein the second engagement protrusions are configured to be elastically deformable in the direction towards the shaft due to the external force applied in the direction perpendicular to the axis of the shaft.

8. The electronic device of claim 1, wherein the lower end of the shaft is configured to be positioned on a lower portion of the first structure that is opposite to the upper portion of the first structure and the upper end of the shaft is configured to be positioned on an upper portion of the third structure,
wherein the first engagement portion comprises a pair of first engagement protrusions that form a first rhombus shape that has a first diagonal line portion of the shaft proximal to the lower end of the shaft, the pair of first engagement protrusions being disposed on two opposite sides of the shaft, and
wherein the pair of first engagement protrusions are configured to be elastically deformable in a direction towards the shaft in response to an external force applied in a direction perpendicular to an axis of the shaft.

9. The electronic device of claim 8, wherein the second engagement portion comprises a pair of second engagement protrusions forming a rhombus shape that has a second diagonal line portion of the shaft at a predetermined position between the upper end of the shaft and the lower end of the shaft, the pair of second engagement protrusions being disposed on two opposite sides of the shaft, and
wherein the second engagement protrusions are configured to be elastically deformable in the direction towards the shaft due to the external force applied in the direction perpendicular to the axis of the shaft.

10. The electronic device of claim 8, wherein the second engagement portion comprises a pair of second engagement protrusions forming a rhombus shape that has a second diagonal line portion of the shaft proximal to the upper end of the shaft, the pair of second engagement protrusions being disposed on two opposite sides of the shaft, and
wherein the second engagement protrusions are configured to be elastically deformable in a direction towards the shaft in response to the external force applied in the direction perpendicular to the axis of the shaft.

11. The electronic device of claim 1, wherein the lower end of the shaft is positioned on a lower portion of the first structure that is opposite to the upper portion of the first structure and the upper end of the shaft is positioned on an upper portion of the third structure,
wherein the first engagement portion is disposed proximal to the lower end of the shaft, and the second engagement portion is disposed proximal to the upper end of the shaft, and
wherein the integrated fastening structure further comprises:
a stopper portion disposed between the first engagement portion and the second engagement portion; and
at least one elastic member disposed to surround the shaft in at least one of a space between the first engagement portion and the stopper portion or a space between the stopper portion and the second engagement portion.

12. The electronic device of claim 1, wherein the first structure is a portion of a chassis forming a portion of an exterior of the electronic device,
wherein the second structure is a portion of a printed circuit board (PCB), and
wherein the third structure comprises a heat sink for dissipating heat from the PCB.

13. An electronic device comprising:
a first structure comprising a first fastening structure;
a second structure disposed on an upper portion of the first structure and comprising a second fastening structure;
a third structure disposed on an upper portion of the second structure and comprising a third fastening structure; and
an integrated fastening structure comprising a first engagement portion and a second engagement portion, the integrated fastening structure being configured to directly connect the first structure, the second structure, and the third structure,
wherein each of the first engagement portion and the second engagement portion is configured to engage a different fastening structure among the first fastening structure, the second fastening structure, and the third fastening structure,
wherein the integrated fastening structure further comprises a shaft extending between (i) a lower end of the shaft positioned on a lower portion of the first structure that is opposite to the upper portion of the first structure and (ii) an upper end of the shaft positioned on an upper portion of the third structure,
wherein the first engagement portion is disposed proximal to the lower end of the shaft, and the second engagement portion is disposed at a predetermined position between the upper end of the shaft and the lower end of the shaft, and
wherein the integrated fastening structure further comprises:
a stopper portion disposed proximal to the upper end of the shaft; and
at least one elastic member disposed to surround the shaft in at least one of a space between the first engagement portion and the second engagement portion or a space between the second engagement portion and the stopper portion.

14. An integrated fastening structure configured to directly connect a plurality of structures of an electronic device, the integrated fastening structure comprising:
a shaft extending between an upper end of the shaft and a lower end of the shaft;
a first engagement portion provided at the lower end of the shaft, the first engagement portion comprising a pair of first engagement protrusions extending in a first direction toward the upper end or the lower end of the shaft from two opposite sides and inclined away from the shaft, the pair of first engagement protrusions configured to be elastically deformable in a direction towards the shaft in response to an external force applied in a direction perpendicular to an axis of the shaft; and
a second engagement portion provided at the upper end of the shaft or at a predetermined position between the upper end of the shaft and the lower end of the shaft, the second engagement portion comprising a pair of second engagement protrusions extending in a second direction toward the upper end or the lower end of the shaft from two opposite sides and inclined away from the shaft, the pair of second engagement protrusions configured to be elastically deformable in the direction towards the shaft in response to the external force applied in the direction perpendicular to the axis of the shaft, wherein at least one of the first engagement portion or the second engagement portion comprises:
 a pair of enforcement protrusions extending toward an end of the shaft opposite to the first direction or the second direction, respectively, from two opposite sides and inclined away from the shaft, the pair of enforcement protrusions being configured to connect to a pair of engagement protrusions of the at least one of the first engagement portion or the second engagement portion.

15. The integrated fastening structure of claim 14, wherein the first engagement portion further comprises a center portion extending in the direction perpendicular to the axis of the shaft, and
 wherein each of the pair of first engagement protrusions extends toward the upper end of the shaft from two opposite sides of the center portion and is inclined away from the shaft.

16. The integrated fastening structure of claim 14, wherein the second engagement portion further comprises a center portion extending in the direction perpendicular to the axis of the shaft, and
 wherein each of the pair of second engagement protrusions extends toward the lower end of the shaft or the upper end of the shaft from two opposite sides of the center portion and is inclined away from the shaft.

17. The integrated fastening structure of claim 14, wherein at least one of the pair of first engagement protrusions or the pair of second engagement protrusions forms a rhombus shape having a diagonal line portion of the shaft, and extends symmetrically on two opposite sides of the shaft.

18. The integrated fastening structure of claim 14, wherein the plurality of structures comprises:
 a first structure comprising a first fastening structure;
 a second structure disposed on an upper portion of the first structure and comprising a second fastening structure; and
 a third structure disposed on an upper portion of the second structure and comprising a third fastening structure.

19. The integrated fastening structure of claim 18, wherein the first structure is a portion of a chassis that forms a portion of an exterior of the electronic device,
 wherein the second structure is a portion of a printed circuit board (PCB), and
 wherein the third structure comprises a heat sink for dissipating heat from the PCB.

20. The integrated fastening structure of claim 18, wherein the first engagement portion is configured to engage to the first fastening structure on a lower portion of the first structure that is opposite to the upper portion of the first structure, and
 wherein the second engagement portion is configured to (i) engage to the second fastening structure on a lower portion of the second structure that is opposite to the upper portion of the second structure or (ii) engage to the third fastening structure on an upper portion of the third structure.

* * * * *